(12) United States Patent
Song et al.

(10) Patent No.: US 8,004,078 B1
(45) Date of Patent: Aug. 23, 2011

(54) ADHESIVE COMPOSITION FOR SEMICONDUCTOR DEVICE

(75) Inventors: Jae Kyu Song, Kyunggi-do (KR); Bong Chan Kim, Kyunggi-do (KR); Min Yoo, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/405,854

(22) Filed: Mar. 17, 2009

(51) Int. Cl.
*H01L 23/48* (2006.01)
*G02B 6/12* (2006.01)

(52) U.S. Cl. ......... 257/701; 257/E23.193; 257/E21.505; 257/789; 257/791; 257/792; 257/700; 257/758; 430/270.1; 562/30; 562/58

(58) Field of Classification Search ................. 257/701, 257/789, 791, 792, E21.505, E23.193, 700, 257/758; 430/270.1; 562/30, 58
See application file for complete search history.

(56) References Cited

U.S. PATENT DOCUMENTS

| | | | |
|---|---|---|---|
| 4,426,240 A | 1/1984 | Louis et al. | |
| 5,844,309 A * | 12/1998 | Takigawa et al. | 257/701 |
| 6,096,414 A * | 8/2000 | Young | 428/220 |
| 6,195,156 B1 * | 2/2001 | Miyamoto et al. | 355/85 |
| 6,225,379 B1 | 5/2001 | Kwak et al. | |
| 6,620,862 B2 | 9/2003 | Ueda et al. | |
| 6,884,695 B2 | 4/2005 | Ueda et al. | |
| 6,903,242 B2 * | 6/2005 | Terada et al. | 588/312 |
| 6,949,678 B2 * | 9/2005 | Kunimoto et al. | 564/255 |
| 6,971,391 B1 * | 12/2005 | Wang et al. | 128/846 |
| 7,189,489 B2 * | 3/2007 | Kunimoto et al. | 430/270.1 |
| 7,759,043 B2 * | 7/2010 | Tanabe et al. | 430/270.1 |
| 2007/0197114 A1 * | 8/2007 | Grove | 442/180 |
| 2007/0207571 A1 * | 9/2007 | Morisue et al. | 438/107 |
| 2009/0097759 A1 * | 4/2009 | Chang | 382/232 |
| 2009/0246906 A1 * | 10/2009 | Robinson et al. | 438/84 |
| 2009/0258224 A1 * | 10/2009 | Kawabe et al. | 428/339 |
| 2009/0311537 A1 * | 12/2009 | Inaba | 428/429 |
| 2010/0236689 A1 * | 9/2010 | Amano et al. | 156/64 |
| 2010/0271831 A1 * | 10/2010 | Kosowsky et al. | 362/382 |
| 2010/0303406 A1 * | 12/2010 | Kodama et al. | 385/14 |

* cited by examiner

*Primary Examiner* — Alexander O Williams
(74) *Attorney, Agent, or Firm* — Gunnison, McKay & Hodgson, L.L.P.; Serge J. Hodgson

(57) ABSTRACT

Provided is an adhesive composition for a semiconductor device. For example, the adhesive composition comprises a binder resin and a silicon carbide filler. The silicon carbide filler has relatively high thermal conductivity and a relatively low coefficient of thermal expansion (CTE). Accordingly, the adhesive composition containing the silicon carbide filler exhibits improved heat dissipation performance and electrical performance due to high thermal conductivity and shows inhibition of delamination or cracking of semiconductor devices due to low CTE. The silicon carbide has high thermal conductivity, but is electrically non-conductive. Therefore, an electrically conductive adhesive can be obtained by additional incorporation of a silver (Ag) filler into the binder resin.

20 Claims, 5 Drawing Sheets

ADHESIVE COMPOSITION FOR SEMICONDUCTOR DEVICE

BACKGROUND OF THE INVENTION

1. Field of the Invention

The present invention relates to an adhesive composition for a semiconductor device.

2. Description of the Related Art

In the assembly of semiconductor devices, adhesion of a semiconductor die to a die pad of a lead frame or to a circuit board typically employs electrically conductive adhesives or thermally conductive adhesives. These adhesives are composed mainly of fillers, binder resins, hardeners, diluents, and additives. The binder resin per se is an insulator, but becomes thermally or electrically conductive if a filler with excellent thermal or electrical conductivity is dispersed therein.

For example, when silver (Ag) is used as a filler, an adhesive with excellent electrical conductivity is obtained. On the other hand, when silica ($SiO_2$) or Teflon is used as a filler, an adhesive with low thermal conductivity is obtained.

The adhesive is typically heat-hardened at a given temperature for several minutes to several hours. When the adhesive is allowed to cool to room temperature after being solidified at a high temperature, thermal stress may take place due to the difference in the coefficient of thermal expansion between the semiconductor die and the die pad.

When the adhesive employs silver (Ag) as a filler, the thermal stress between the semiconductor die and the die pad is not sufficiently alleviated because a thermal expansion coefficient of silver is relatively large. As a consequence, this may undesirably result in the occurrence of delamination or cracking between the semiconductor die and the die pad.

On the other hand, when the adhesive is prepared using silica or Teflon as a filler, this may disadvantageously result in difficulty of rapid external dissipation of heat from the semiconductor die, due to significantly low thermal conductivity of the silica or Teflon as compared to silver. Consequently, electrical performance of the semiconductor device is also deteriorated.

BRIEF SUMMARY OF THE INVENTION

Provided is an adhesive composition for a semiconductor device. For example, the adhesive composition comprises a binder resin and a silicon carbide filler. The silicon carbide filler has relatively high thermal conductivity and a relatively low coefficient of thermal expansion (CTE). Accordingly, the adhesive composition containing the silicon carbide filler exhibits improved heat dissipation performance and electrical performance due to high thermal conductivity and shows inhibition of delamination or cracking of semiconductor devices due to low CTE. The silicon carbide has high thermal conductivity, but is electrically non-conductive. Therefore, an electrically conductive adhesive can be obtained by additional incorporation of a silver (Ag) filler into the binder resin.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1A:
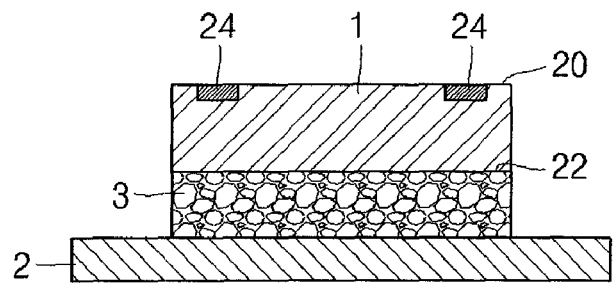
FIGS. 1A, 1B, 1C are a series of cross-sectional views illustrating an example of the application of an adhesive composition for a semiconductor device in accordance with the present invention.
Figure 1B:
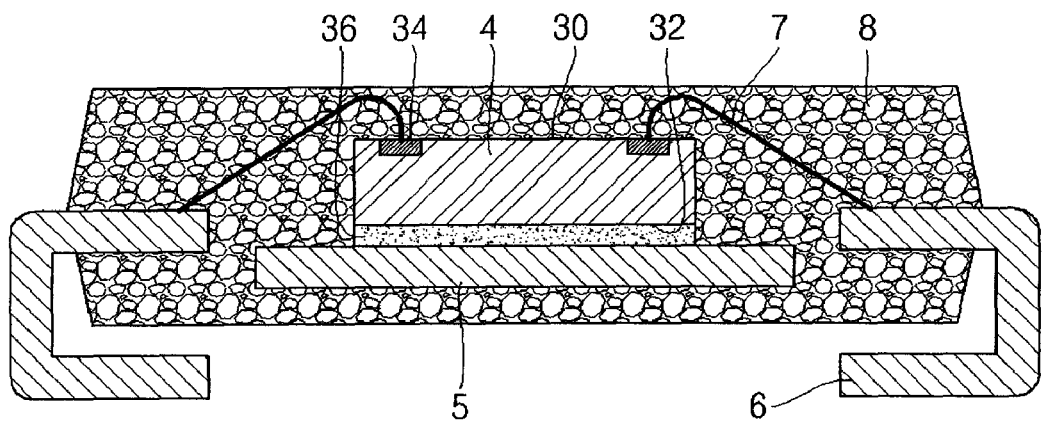
Figure 1C:
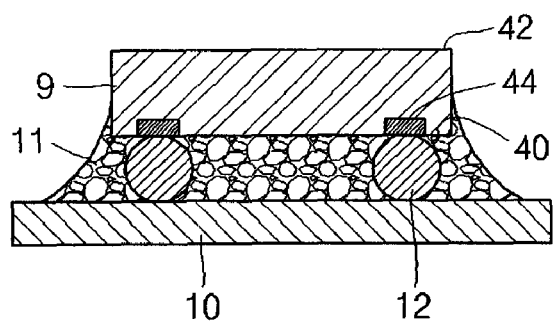

Referring to FIGS. 1A to 1C, there are illustrated cross-sectional views of semiconductor devices to which an adhesive composition in accordance with the present invention is applied.

As shown in FIG. 1A, the adhesive composition in accordance with the present invention may be used as an adhesive 3 for adhesion of a semiconductor die 1 and a substrate 2. Substrate 2 may be a die pad, e.g., of a leadframe, a circuit board, or other substrate.

More particularly, semiconductor die 1 includes an active surface 20 and an inactive surface 22. Active surface 20 includes bond pads 24 thereon. Inactive surface 22 is mounted to substrate 2 with adhesive 3. Adhesive 3 is any one of the adhesive compositions in accordance with embodiments of the present invention as set forth below.

As shown in FIG. 1B, the adhesive composition in accordance with the present invention may also be used as an encapsulant 8 for encapsulating a semiconductor die 4, a die pad 5 of a substrate, a lead 6 of a substrate and a conductive wire 7.

More particularly, semiconductor die 4 includes an active surface 30 and an inactive surface 32. Active surface 30 includes bond pads 34 thereon. Inactive surface 32 is mounted to die pad 5 with adhesive 36. Illustratively, adhesive 36 is any one of the adhesive compositions in accordance with embodiments of the present invention as set forth below although may also be formed of a standard die attach adhesive.

Bond pads 34 are electrically connected to leads 6 by conductive wires 7. Encapsulant 8 is any one of the adhesive compositions that is a dielectric (an electrical insulator) in accordance with embodiments of the present invention as set forth below.

As shown in FIG. 1C, the adhesive composition in accordance with the present invention may also be used as an underfill 11 which is filled between a semiconductor die 9 and a substrate 10. Conductive bumps 12 provide physical and electrical connection between the semiconductor die 9 and the substrate 10.

More particularly, semiconductor die 9 includes an active surface 40 and an inactive surface 42. Active surface 40 includes bond pads 44 thereon. Bond pads 44 are electrically connected to terminals of substrate 10 by conductive bumps 12. Underfill 11 fills the space between active surface 40 and substrate 10 and encloses and protects conductive bumps 12.

Underfill 11 is any one of the adhesive compositions that is a dielectric (an electrical insulator) in accordance with embodiments of the present invention as set forth below.

As will be described hereinafter, such an adhesive composition may have either or both of thermal conductivity and electrical conductivity. When the composition exhibits only the thermal conductivity and is an electrical insulator, it may be used not only as an adhesive but also as an encapsulant, e.g., encapsulant 8 of FIG. 1B, and underfill, e.g., underfill 11 of FIG. 1C.

The adhesive composition may be comprised of a binder resin and a thermally conductive filler.

There is no particular limit to the binder resin that can be used in accordance with the present invention. For example, the binder resin may be at least one selected from the group consisting of an epoxy resin, a phenol resin, a polyimide resin, a polyurethane resin, a silicone resin, a polyester resin, an acrylate, bismaleimide (BMI), and equivalents thereof. The binder resin provides intimate adhesion between an adherent and the thermally conductive filler or an electrically conductive filler which will be illustrated hereinafter. The binder resin also serves to elicit thermal or electrical conductivity through chain-like connection of the filler. Further, the binder resin also improves physical and chemical stability of the adhesive composition.

There is no particular limit to the thermally conductive filler that can be used in accordance with the present invention. For example, the thermally conductive filler may be at least one selected from the group consisting of silicon carbide (SiC), tungsten semicarbide ($W_2C$), tungsten carbide (WC), boron carbide ($B_4C$) and equivalents thereof. A maximum particle size of the thermally conductive filler may be 25 μm or less. A content of the thermally conductive filler may be in the range of 10 to 90% by weight, based on 100% by weight of the binder resin. If a content of the thermally conductive filler is less than 10% by weight, this may result in insufficient thermal conductivity and excessively low viscosity.

Low viscosity means that it may be difficult to handle and control the process due to excessively easy outflow of the adhesive composition from a tool, during a dispensing process of the adhesive or underfill formed by the adhesive composition or an encapsulation process of the encapsulant formed by the adhesive composition. On the other hand, if a content of the thermally conductive filler is higher than 90% by weight, this may result in decreased adhesive strength and excessively high viscosity of the adhesive composition. High viscosity of the adhesive composition results in poor workability due to no outflow of the adhesive composition from the tool, during the dispensing or encapsulation process.

Figure 2:
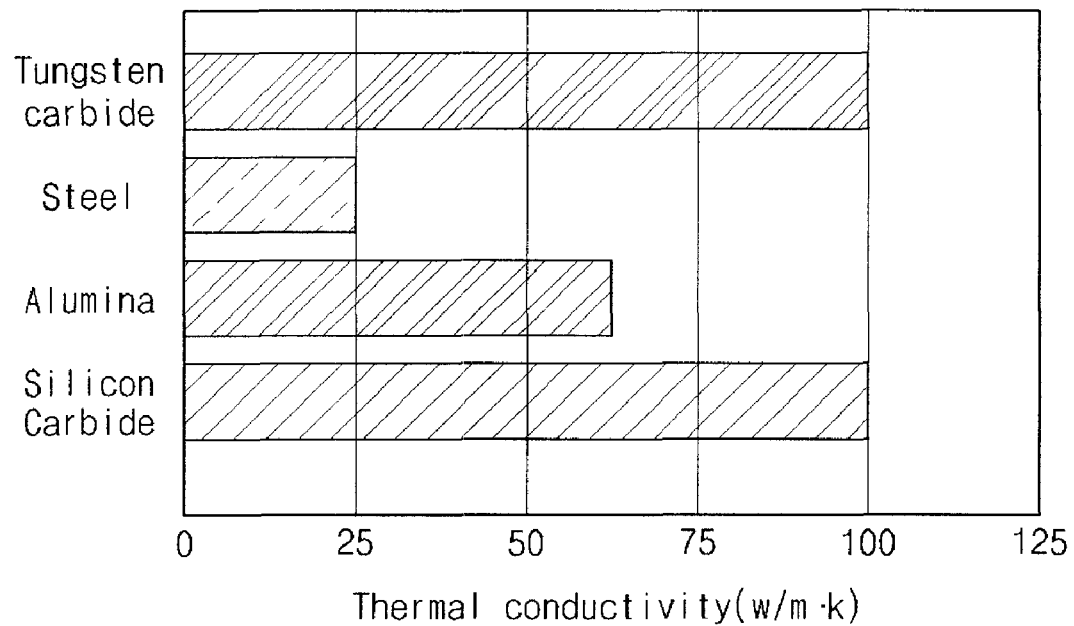
FIG. 2 is a graph illustrating thermal conductivities of materials of adhesive compositions in accordance with the present invention.

Referring to FIG. 2, there is illustrated a graph depicting thermal conductivities of materials of adhesive compositions in accordance with the present invention.

As shown in FIG. 2, for example, silicon carbide and tungsten carbide have thermal conductivity of approximately 100 w/m*k, respectively. On the other hand, steel and alumina exhibit thermal conductivity of approximately 25 w/m*k and 60 w/m*k, respectively.

Figure 3:
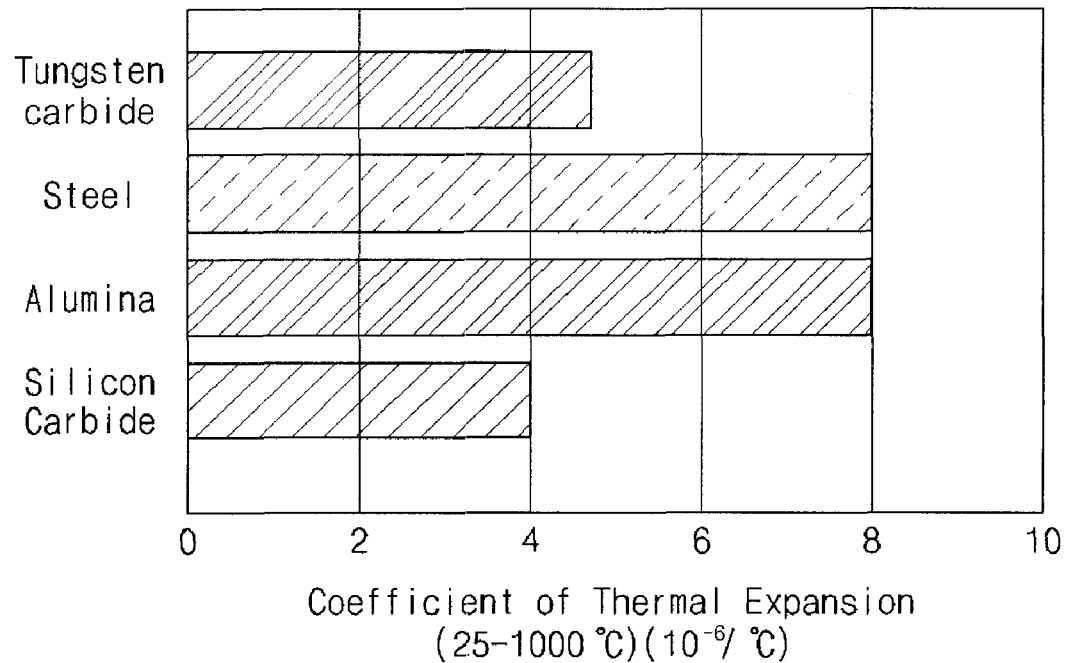
FIG. 3 is a graph illustrating thermal expansion coefficients of materials of adhesive compositions in accordance with the present invention.

Referring to FIG. 3, there is illustrated a graph depicting thermal expansion coefficients of materials of adhesive compositions in accordance with the present invention.

As shown in FIG. 3, for example, silicon carbide and tungsten carbide have a thermal expansion coefficient of approximately 4 and 5 (25-1000° C.) ($10^{-6}$/° C.), respectively. On the other hand, steel and alumina have a thermal expansion coefficient of approximately 8 (25-1000° C.) ($10^{-6}$/° C.), respectively.

As such, the thermally conductive filler of the present invention, such as silicon carbide or tungsten carbide, has relatively very high thermal conductivity but exhibits a relatively very low thermal expansion coefficient.

Therefore, a semiconductor device using the adhesive composition of the present invention has excellent heat dissipation properties and consequently improved electrical properties. Further, a semiconductor device using the adhesive composition of the present invention exhibits no occurrence of delamination or cracking between individual constituent components of the semiconductor device due to a small thermal expansion rate of the adhesive composition, which consequently results in improved reliability of the semiconductor device.

The adhesive composition may further comprise an electrically conductive filler. For example, the composition may further comprise at least one selected from the group consisting of silver (Ag), copper (Cu), nickel (Ni), silver/palladium (Ag/Pd), carbon, graphite and equivalents thereof. A maximum particle size of the electrically conductive filler may be 25 μm or less. A content of the electrically conductive filler may be in the range of 10 to 90% by weight, based on 100% by weight of the resin. If a content of the electrically conductive filler is less than 10% by weight, this may result in lowering of electrical conductivity. On the other hand, if a content of the electrically conductive filler is higher than 90% by weight, this may result in excessively high viscosity which, in turn, leads to poor workability during the dispensing or encapsulation process.

In addition, the adhesive composition may further comprise another thermally conductive filler (second thermally conductive filler). For example, the second thermally conductive filler may be at least one selected from the group consisting of silica ($SiO_2$), polytetrafluoroethylene (PTFE) and equivalents thereof. A maximum particle size of the second thermally conductive filler may be 25 μm or less. A content of the second thermally conductive filler may be in the range of 10 to 90% by weight, based on 100% by weight of the resin. If a content of the second thermally conductive filler is less than 10% by weight, thermal conductivity of the adhesive composition decreases. On the other hand, if a content of the thermally conductive filler is higher than 90% by weight, viscosity of the adhesive composition is excessively high, which consequently leads to poor workability during the dispensing or encapsulation process.

In addition, the adhesive composition may further comprise a hardener for control of a hardening time, a diluent for control of viscosity, and other additives for improvement of physical properties and removal of foams.

Now, the present invention will be described in more detail with reference to the following examples. These examples are provided only for illustration and should not be construed as limiting the scope and spirit of the present invention.

Example 1-1

Based on 100% by weight of a binder resin and any other organics such as a hardener, a diluent, and an adhesion promoter, 23% by weight of a silicon carbide filler and 55% by weight of a silver (Ag) filler were mixed, amounting to 78% by weight of the total filler components. Stated another way, the adhesive composition is formed from an organic part (including one or more of a binder resin, a hardener, a diluent, an adhesion promoter, or other organic) and an inorganic part (including the silicon carbide filler and silver (Ag) filler). For 1 gram of adhesive composition, there is 0.22 g (22%) of the organic part, 0.23 g (23%) of the silicon carbide filler and 0.55 g (55%) of the silver filler. This description applies to the respective components in the other examples 1-2 to 1-5. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 1-2

Based on 100% by weight of a binder resin and any other organics such as a hardener, a diluent, and an adhesion promoter, 39% by weight of a silicon carbide filler and 39% by weight of a silver (Ag) filler were mixed. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 1-3

Based on 100% by weight of a binder resin and any other organics such as a hardener, a diluent, and an adhesion promoter, 55% by weight of a silicon carbide filler and 23% by weight of a silver (Ag) filler were mixed. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 1-4

Based on 100% by weight of a binder resin and any other organics such as a hardener, a diluent, and an adhesion promoter, 65% by weight of a silicon carbide filler was added without a silver (Ag) filler. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 1-5

Based on 100% by weight of a binder resin and any other organics such as a hardener, a diluent, and an adhesion promoter, 60% by weight of a silicon carbide filler was added without a silver (Ag) filler and without a silica ($SiO_2$) filler. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Comparative Example 1-1

An adhesive composition was prepared using silica filler epoxy (Ablebond® 2025DSi adhesive available from Ablestik of Rancho Dominguez, Calif.) as a filler. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Comparative Example 1-2

An adhesive composition was prepared using silver filler epoxy (Ablebond® 8290 adhesive available from Ablestik of Rancho Dominguez, Calif.) as a filler. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

The compositions and results of Examples 1-1 to 1-5 and Comparative Examples 1-1 and 1-2 are summarized in Tables 1 and 2 below, in conjunction with FIG. 4.

TABLE 1

| | | | Example | | | | |
|---|---|---|---|---|---|---|---|
| | | | E1-1 SiC:Ag 23:55 | E1-2 SiC:Ag 39:39 | E1-3 SiC:Ag 55:23 | E1-4 SiC:Ag 65:0 | E1-5 SiC:$SiO_2$ 60:0 |
| Filler content | wt % | | 78 | 78 | 78 | 65 | 60 |
| Thermal Conductivity | W/m * k | 1 | 2.269 | 2.583 | 2.926 | 2.319 | 0.894 |
| | | 2 | 2.237 | 2.840 | 2.659 | 1.689 | 1.127 |
| | | AVG | 2.253 | 2.7115 | 2.7925 | 2.004 | 1.0105 |
| | | STD | 0.023 | 0.182 | 0.189 | 0.445 | 0.165 |

TABLE 2

| | | | Example | |
|---|---|---|---|---|
| | | | CE1-1 2025DSi | CE1-2 8290 |
| Filler Content | wt % | | 50 | 78 |
| Thermal Conductivity | W/m * k | 1 | 0.476 | 1.540 |
| | | 2 | 0.526 | 1.437 |
| | | AVG | 0.501 | 1.4885 |
| | | STD | 0.035 | 0.073 |

Figure 4:
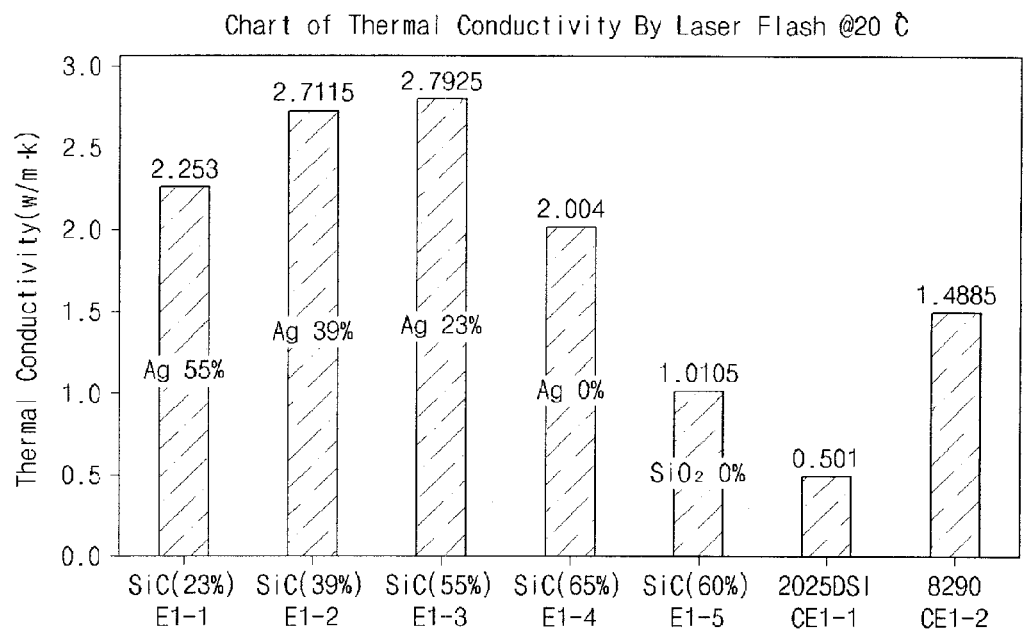
FIG. 4 is a graph illustrating thermal conductivity performance of adhesive compositions in accordance with the present invention.

Referring to Tables 1 and 2 in conjunction with FIG. 4, it can be seen that thermal conductivity of the adhesive composition in accordance with the present invention increases with a higher content (wt %) of the silicon carbide filler in the binder resin in examples 1-1, 1-2, 1-3. In all examples 1-1, 1-2, 1-3, the total filler components was equal and amounted to 78% by weight. However, the value of thermal conductivity was highest in the adhesive composition with incorporation of 55% by weight of the silicon carbide filler and 23% by weight of the silver (Ag) filler as illustrated by example 1-3. The value of thermal conductivity was lowest in the adhesive composition with incorporation of 23% by weight of the silicon carbide filler and 55% by weight of the silver (Ag) filler as illustrated by example 1-1.

Further, as illustrated by example 1-4, the thermal conductivity was not significantly high when the silicon carbide filler alone was added without the silver filler to the binder resin. That is, it can be seen that the thermal conductivity is higher when the silicon carbide filler and the silver filler are added at proper contents as illustrated by examples 1-1, 1-2, 1-3, which is an unexpected result.

Further, when the silicon carbide filler alone was added in the binder resin, the thermal conductivity of the composition was variable depending on a content (wt %) of the silicon carbide filler. That is, a higher thermal conductivity value was obtained with incorporation of 65% by weight of the silicon carbide filler into the binder resin as illustrated by example 1-4, as compared to addition of 60% by weight of the same filler as illustrated in example 1-5.

When only the silica filler was added to the binder resin, the lowest thermal conductivity was obtained as illustrated by comparative example 1-1.

On the other hand, when only the silver filler was added to the binder resin, the thermal conductivity value was relatively high as illustrated by comparative example 1-2. Unfortunately, the thus-obtained thermal conductivity value was inferior to that of the adhesive composition with combined addition of the silicon carbide filler and the silver filler as illustrated by examples 1-1, 1-2, 1-3.

Figure 5:
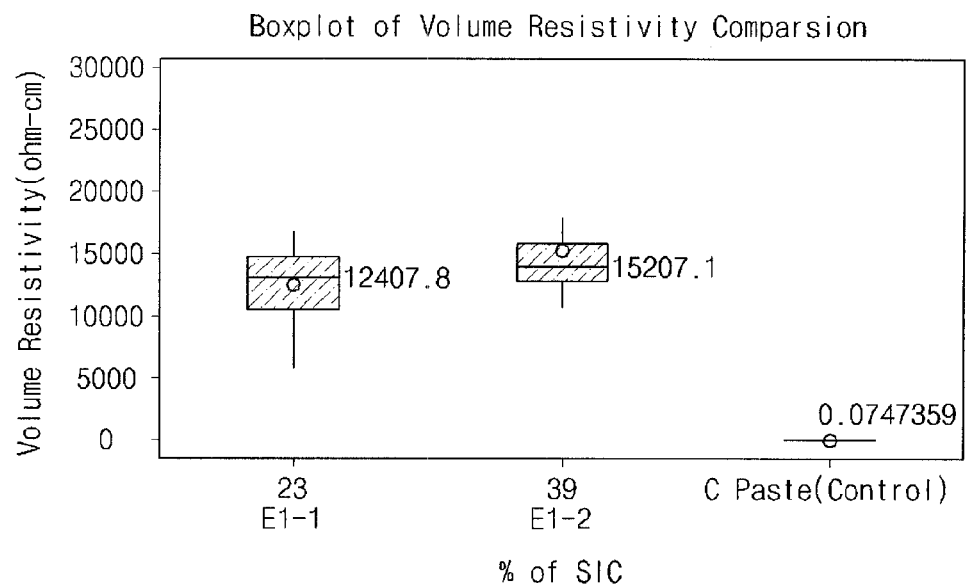
FIG. 5 is a graph illustrating electrical conductivity performance of adhesive compositions in accordance with the present invention.

Referring to FIG. 5, there is illustrated a graph depicting electrical conductivity performance of adhesive compositions in accordance with the present invention.

In FIG. 5, the X-axis represents wt % of silicon carbide and the Y-axis represents volume resistivity (ohm-cm). As used herein, the term "volume resistivity" refers to a resistance value as measured along a surface of the adhesive composition. In FIG. 5, from left to right, the results for examples 1-1, 1-2, and a paste (control) are illustrated.

As shown in FIG. 5, the volume resistivity increased with an increasing content (wt %) of the silicon carbide filler. In other words, it can be confirmed that the adhesive with incorporation of the silicon carbide filler is basically electrically a semiconductor, i.e., has an electrical conductivity between those of a conductor and an insulator. Therefore, when a silver (Ag) filler is added to the adhesive with incorporation of the silicon carbide filler, the adhesive becomes electrically conductive. Further, when a silica ($SiO_2$) filler is added to the adhesive with incorporation of the silicon carbide filler, the adhesive becomes electrically non-conductive.

Example 2-1

An adhesive composition was formed consisting of 22% by weight of a binder resin plus a hardener and 78% by weight of a silver (Ag) filler. Stated another way, the adhesive composition is formed from an organic part (including one or more of a binder resin, a hardener, a diluent, an adhesion promoter, or other organic) and an inorganic part (the silver (Ag) filler). For 1 gram of adhesive composition, there is 0.22 g (22%) of the organic part, 0.78 g (78%) of the silver (Ag) filler. This description applies to the respective components in the other examples 2-2, 2-3, 2-4, 2-5, 2-6, 3-1, 3-2, 3-3, 3-4, 3-5, 3-6. No silicon carbide filler was added thereto. Viscosity of the adhesive composition was measured at 0.5 and 5 rpm, respectively. Further, a thixotropic index was calculated as a ratio of the two viscosity values measured at 0.5 and 5 rpm. Small values of the viscosity and thixotropic index mean that fluidity of the composition is high like water, whereas large values of the viscosity and thixotropic index mean that fluidity of the composition is low. Therefore, workability of the dispensing or encapsulation process can be inferred from these values.

Analogously to Example 1-1, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 2-2

An adhesive composition was formed consisting of 45% by weight of a binder resin plus a hardener and 55% by weight of a silicon carbide filler. No silver (Ag) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 2-3

An adhesive composition was formed consisting of 40% by weight of a binder resin plus a hardener and 60% by weight of a silicon carbide filler. No silver (Ag) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 2-4

An adhesive composition was formed consisting of 35% by weight of a binder resin plus a hardener and 65% by weight of a silicon carbide filler. No silver (Ag) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 2-5

An adhesive composition was formed consisting of 30% by weight of a binder resin plus a hardener and 70% by weight of a silicon carbide filler. No silver (Ag) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 2-6

An adhesive composition was formed consisting of 25% by weight of a binder resin plus a hardener and 75% by weight of a silicon carbide filler. No silver (Ag) filler was added thereto. Viscosity of the adhesive composition was measured at 0.5 and 5 rpm, respectively.

Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method. However, viscosity and thermal conductivity of the resulting adhesive composition were non-measurable.

Example 3-1

An adhesive composition was formed consisting of 50% by weight of a binder resin plus a hardener and 50% by weight of a silica ($SiO_2$) filler. No silicon carbide filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 3-2

An adhesive composition was formed consisting of 50% by weight of a binder resin plus a hardener and 50% by weight of a silicon carbide filler. No silica ($SiO_2$) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 3-3

An adhesive composition was formed consisting of 45% by weight of a binder resin plus a hardener and 55% by weight of a silicon carbide filler. No silica ($SiO_2$) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 3-4

An adhesive composition was formed consisting of 40% by weight of a binder resin plus a hardener and 60% by weight of a silicon carbide filler. No silica ($SiO_2$) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 3-5

An adhesive composition was formed consisting of 35% by weight of a binder resin plus a hardener and 65% by weight of a silicon carbide filler. No silica ($SiO_2$) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

Example 3-6

An adhesive composition was formed consisting of 30% by weight of a binder resin plus a hardener and 70% by weight of a silicon carbide filler. No silica ($SiO_2$) filler was added thereto. Viscosity of the adhesive composition was measured at 0.5 and 5 rpm, respectively. Further, a thixotropic index was calculated as a ratio of the two viscosity values measured at 0.5 and 5 rpm. Further, the resulting adhesive composition was coated to a thickness of about 0.3 mm and hardened at 175° C. for 15 minutes. After hardening of the adhesive coating was complete, its thermal conductivity (w/m*k) was measured at 25° C. using a laser flash method.

The compositions and results of Examples 2-1 to 2-6 are summarized in Table 3 below. The compositions and results of Examples 3-1 to 3-6 are summarized in Table 4 below.

Figure 6:
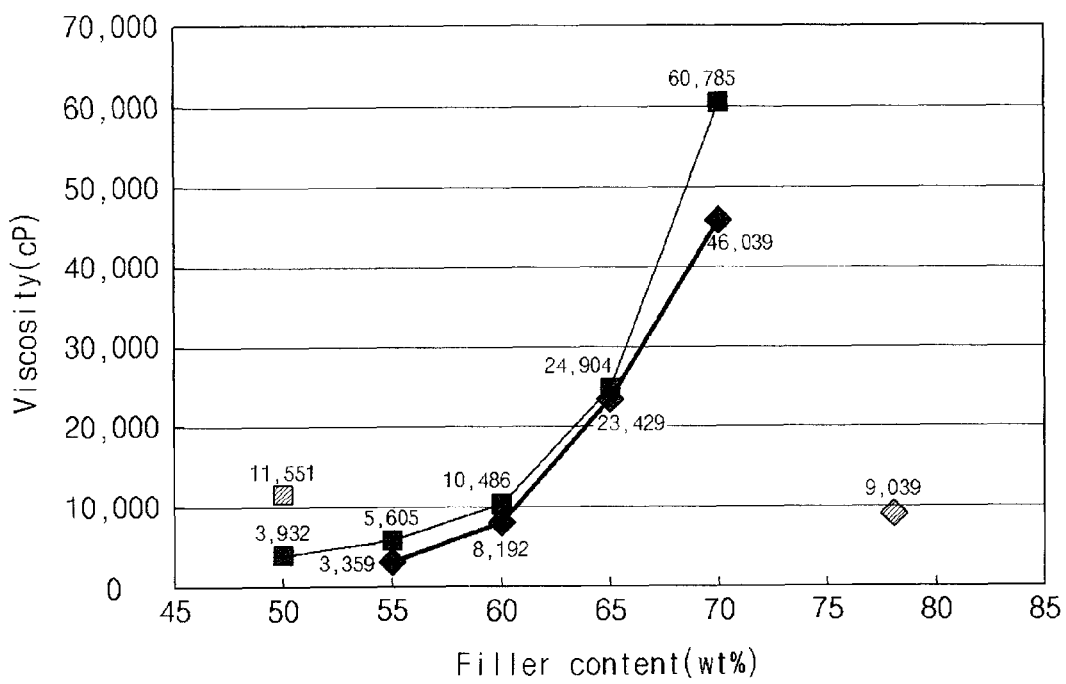
FIG. 6 is a graph illustrating the filler content vs. viscosity relationship of adhesive compositions in accordance with the present invention.
Figure 7:
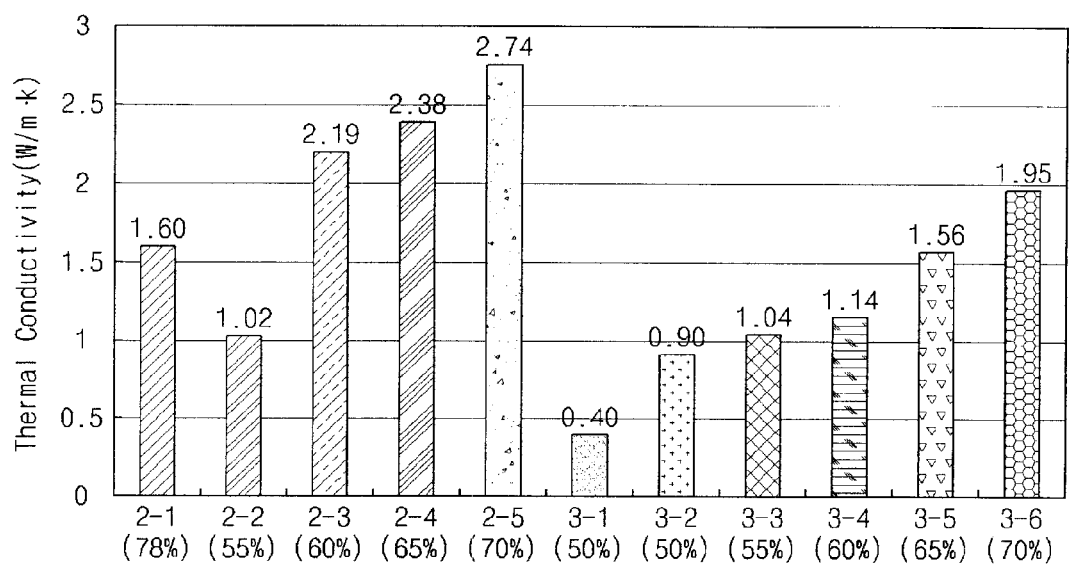
FIG. 7 is a graph illustrating thermal conductivity of adhesive compositions in accordance with the present invention.

Further, FIG. 6 summarizes the filler content vs. viscosity relationships in Examples 2-1 to 2-6 and Examples 3-1 to 3-6, and FIG. 7 summarizes thermal conductivity of the adhesive compositions according to respective Examples.

| Example | | 2-1 | 2-2 | 2-3 | 2-4 | 2-5 | 2-6 |
|---|---|---|---|---|---|---|---|
| Resin & Hardener | | 22% | 45% | 40% | 35% | 30% | 25% |
| Filler | (Ag) | 78% | 0% | 0% | 0% | 0% | 0% |
| | (SiC) | 0% | 55% | 60% | 65% | 70% | 75% |
| Total | | 100% | 100% | 100% | 100% | 100% | 100% |
| Viscosity 0.5 rpm | | 50,790 | 13,107 | 18,022 | 34,406 | 77,824 | N/A |
| Viscosity 5.0 rpm | | 9,039 | 3,359 | 8,192 | 23,429 | 46,039 | N/A |
| Thixotropic Index | | 5.62 | 3.90 | 2.20 | 1.47 | 1.69 | N/A |
| Thermal conductivity | | 1.60 | 1.02 | 2.19 | 2.38 | 2.74 | N/A |

| Example | | 3-1 | 3-2 | 3-3 | 3-4 | 3-5 | 3-6 |
|---|---|---|---|---|---|---|---|
| Resin & Hardener | | 50% | 50% | 45% | 40% | 35% | 30% |
| Filler | ($SiO_2$) | 50% | 0% | 0% | 0% | 0% | 0% |
| | (SiC) | 0% | 50% | 55% | 60% | 65% | 70% |
| Total | | 100% | 100% | 100% | 100% | 100% | 100% |
| Viscosity 0.5 rpm | | 51,883 | 12,288 | 10,650 | 18,022 | 35,226 | 110,592 |
| Viscosity 5.0 rpm | | 11,551 | 3,932 | 5,605 | 10,486 | 24,904 | 60,785 |
| Thixotropic Index | | 4.49 | 3.13 | 1.90 | 1.72 | 1.41 | 1.82 |
| Thermal conductivity | | 0.40 | 0.90 | 1.04 | 1.14 | 1.56 | 1.95 |

As shown in Tables 3 and 4 in conjunction with FIG. 6, it can be seen that viscosity of the composition generally increases as a content (wt %) of the filler increases. Therefore, the operator can obtain desired viscosity by appropriately controlling a content (wt %) of the filler according to process characteristics.

As shown in Tables 3 and 4 in conjunction with FIG. 7, it can be seen that thermal conductivity of the composition generally increases as a content (wt %) of the filler increases.

More specifically, referring to examples 2-1, 2-2, 2-3, 2-4, 2-5 and FIG. 7, it can be seen that thermal conductivity of the adhesive composition is lowest in the adhesive containing 55% by weight of the silicon carbide filler without addition of the silver (Ag) filler as illustrated by example 2-2, than the adhesive containing 78% by weight of the silver (Ag) filler without addition of the silicon carbide filler as illustrated by example 2-1. However, when a content of the silicon carbide filler was equal to or higher than 60% by weight without addition of the silver (Ag) filler as illustrated by examples 2-3, 2-4, 2-5, thermal conductivity of the adhesive was higher as compared to when the silver (Ag) filler was added to the adhesive as illustrated by example 2-1. Further, it can be seen that thermal conductivity of the adhesive is further improved with an increasing content of the silicon carbide filler as illustrated by examples 2-2, 2-3, 2-4, 2-5, respectively.

On the other hand, thermal conductivity of the adhesive was higher in the adhesive containing 50% by weight of the silicon carbide filler without addition of the silica filler as illustrated by example 3-2, than the adhesive containing 50% by weight of the silica filler without addition of the silicon carbide filler as illustrated by example 3-1. Further, it can be seen that thermal conductivity of the adhesive is further improved as a content of the silicon carbide filler increases as illustrated by examples 3-2, 3-3, 3-4, 3-5, 3-6, respectively.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. An adhesive composition for a semiconductor device, comprising:
   a binder resin, wherein the binder resin is at least one selected from the group consisting of a polyurethane resin and a polyester resin; and
   a thermally conductive filler mixed with the binder resin, wherein the thermally conductive filler is at least one selected from the group consisting of tungsten semicarbide ($W_2C$), tungsten carbide (WC), and boron carbide ($B_4C$).

2. The adhesive composition of claim 1, wherein a content of the thermally conductive filler is in the range of 10 to 90% by weight, based on 100% by weight of the binder resin.

3. The adhesive composition of claim 1 further comprising:
   an electrically conductive filler which is at least one selected from the group consisting of silver (Ag), copper (Cu), nickel (Ni), silver/palladium (Ag/Pd), carbon, and graphite.

4. The adhesive composition of claim 3, wherein a content of the electrically conductive filler is in the range of 10 to 90% by weight, based on 100% by weight of the resin.

5. The adhesive composition of claim 1 further comprising:
   a second thermally conductive filler which is at least one selected from the group consisting of silica ($SiO_2$) and polytetrafluoroethylene (PTFE).

6. The adhesive composition of claim 5, wherein a content of the second thermally conductive filler is in the range of 10 to 90% by weight, based on 100% by weight of the resin.

7. The adhesive composition of claim 1 further comprising:
   a hardener.

8. The adhesive composition of claim 1 further comprising:
   a diluent.

9. The adhesive composition of claim 1 further comprising:
   an additive.

10. The adhesive composition of claim 1, wherein the semiconductor device comprises:
    a semiconductor die comprising an active surface and an inactive surface;
    a substrate; and
    the adhesive composition mounting the inactive surface of the semiconductor die to the substrate.

11. The adhesive composition of claim 10, wherein a content of the thermally conductive filler is in the range of 10 to 90% by weight, based on 100% by weight of the binder resin.

12. The adhesive composition of claim 10 wherein the adhesive composition further comprises:
    an electrically conductive filler which is at least one selected from the group consisting of silver (Ag), copper (Cu), nickel (Ni), silver/palladium (Ag/Pd), carbon, and graphite.

13. The adhesive composition of claim 12, wherein a content of the electrically conductive filler is in the range of 10 to 90% by weight, based on 100% by weight of the resin.

14. The adhesive composition of claim 10 further comprising:
    a second thermally conductive filler which is at least one selected from the group consisting of silica ($SiO_2$) and polytetrafluoroethylene (PTFE).

15. The adhesive composition of claim 14, wherein a content of the second thermally conductive filler is in the range of 10 to 90% by weight, based on 100% by weight of the resin.

16. The adhesive composition of claim 10 wherein the inactive surface of the semiconductor die is mounted to a die pad of the substrate by the adhesive composition.

17. The adhesive composition of claim 10 wherein the semiconductor device further comprises conductive wires connecting the bond pads to leads of the substrate.

18. The adhesive composition of claim 17 wherein the adhesive composition further encapsulates the semiconductor die, the leads and the conductive wires.

19. The adhesive composition of claim 1, wherein the semiconductor device comprises:
    a semiconductor die comprising an active surface and an inactive surface;
    a substrate; and
    the adhesive composition between the active surface of the semiconductor die and the substrate.

20. The adhesive composition of claim 19 wherein the semiconductor device further comprises:
    conductive bumps physically and electrically connecting bond pads on the active surface of the semiconductor die to the substrate, the adhesive composition enclosing and protecting the conductive bumps.

* * * * *